(12) United States Patent
Kim et al.

(10) Patent No.: US 11,615,969 B2
(45) Date of Patent: Mar. 28, 2023

(54) APPARATUS AND METHOD FOR TREATING SUBSTRATE

(71) Applicant: SEMES CO., LTD., Cheonan-si (KR)

(72) Inventors: Daesung Kim, Suwon-si (KR); Eunwoo Park, Gyeongsan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 225 days.

(21) Appl. No.: 16/896,539

(22) Filed: Jun. 9, 2020

(65) Prior Publication Data

US 2020/0395229 A1    Dec. 17, 2020

(30) Foreign Application Priority Data

Jun. 13, 2019   (KR) .................... 10-2019-0069697

(51) Int. Cl.
  *H01L 21/67* (2006.01)
  *G03F 7/16* (2006.01)
  *B05C 11/02* (2006.01)

(52) U.S. Cl.
  CPC .......... *H01L 21/67017* (2013.01); *G03F 7/16* (2013.01); *H01L 21/6715* (2013.01); *H01L 21/67109* (2013.01); *H01L 21/67173* (2013.01); *B05C 11/02* (2013.01)

(58) Field of Classification Search
  USPC .................................. 118/52, 612, 692, 663
  See application file for complete search history.

(56) References Cited

U.S. PATENT DOCUMENTS

2009/0214759 A1*   8/2009   Matsuoka ......... H01L 21/67178
                                                              427/8

FOREIGN PATENT DOCUMENTS

| JP | H07-254537 A | 10/1995 |
|----|----|----|
| JP | H09-148231 A | 6/1997 |
| JP | H09-148265 A | 6/1997 |
| JP | 2629447 B2 | 7/1997 |
| KR | 10-2006-0093042 A | 8/2006 |

(Continued)

OTHER PUBLICATIONS

English Translation JP2000124099A. (Year: 2000).*

(Continued)

*Primary Examiner* — Yewebdar T Tadesse (74) *Attorney, Agent, or Firm* — Harness, Dickey & Pierce, P.L.C.

(57) ABSTRACT

The apparatus includes a plurality of process chambers having treatment spaces configured to process the substrate in the treatment spaces, and an exhaust unit to exhaust gas from the treatment space. The exhaust unit includes a plurality of individual exhaust pipes directly connected to the treatment spaces in one process chamber or the plurality of process chambers, a main exhaust pipe connected to the plurality of individual exhaust pipes, a pressure reducing member installed in the main exhaust pipe to reduce pressure of the treatment space, and a damper member mounted in each of the individual exhaust pipes to adjust an amount of gas exhausted through the individual exhaust pipe. The damper member includes a first damper to adjust an amount of gas exhausted from the treatment spaces, and a second damper disposed downstream of the first damper to buffer a pressure change caused by adjusting the first damper.

18 Claims, 9 Drawing Sheets

(56) References Cited

FOREIGN PATENT DOCUMENTS

| KR | 10-2010-0020421 A | 2/2010 |
| KR | 100996339 B1 | 11/2010 |
| KR | 101690047 B1 | 12/2016 |
| KR | 10-2017-0015162 A | 2/2017 |
| KR | 101715069 B1 | 3/2017 |
| KR | 10-2018-0122389 A | 11/2018 |

OTHER PUBLICATIONS

Korean Notice of Allowance dated Nov. 25, 2021 for corresponding Korean Application No. 10-2019-0069697.
Korean Office Action dated Oct. 27, 2020 issued in corresponding Korean Appln. No. 10-2019-0069697.
Korean Office Action dated Feb. 1, 2021 issued in corresponding Korean Appln. No. 10-2019-0069697.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0069697 filed on Jun. 13, 2019, in the Korean Intellectual Property Office, the entire contents of which are hereby incorporated by reference.

BACKGROUND

Embodiments of the inventive concept described herein relate to an apparatus and a method for treating a substrate.

To fabricate a semiconductor device, various processes, such as a cleaning, depositing, photolithography, etching, and ion implanting processes. The processes are performed in a chamber having a treatment space therein.

In general, a treatment space in a chamber has a specific air atmosphere which is uniformly maintained. Accordingly, a process atmosphere is exhausted by an exhaust device such that preset pressure is maintained. The exhaust device not only maintains the process atmosphere under specific pressure, but also exhausts a process by-product generated in substrate treatment.

For example, a process by-product, such as a fume, is generated in the process of performing liquid treatment for the substrate or performing a bake process for the substrate when treating the substrate, and is exhausted by the exhaust device.

The exhaust device includes individual ducts connected to a liquid treating chamber, which is to perform liquid treatment for the substrate, or a bake chamber which is to perform heat treatment for the substrate, and a main duct connected from each individual duct. The individual duct connects the chamber to the main duct, and the pressure of the main duct is reduced by a pressure reducing member. The process by-product generated in the chamber is exhausted by sequentially passing through the individual duct and the main duct.

A damper is mounted in each duct to adjust an amount of gas to be exhausted from the chamber by adjusting a sectional area of the duct. However, a pressure change occurs in an adjacent damper when each damper is open or closed, thereby causing a pressure hunting phenomenon inside the duct due to such a duct interference. In addition, as each duct has the shape of a rectangle, the exhaust loss is caused in the process that the gas flowing inside the duct.

SUMMARY

Embodiments of the inventive concept provide an apparatus and a method, capable of minimizing a pressure hunting phenomenon by mounting a first damper and a second damper, which adjusts an interference phenomenon with the first damper, which is adjacent, in an individual exhaust pipe.

Embodiments of the inventive concept provide an apparatus and a method, capable of minimizing an exhaust loss by forming a slope part on a path on which exhaust gas moves.

According to an exemplary embodiment, an apparatus for treating a substrate is provided. The apparatus for treating the substrate may include a plurality of process chambers having treatment spaces in the process chambers to process the substrate in the treatment spaces, and an exhaust unit to exhaust gas from the treatment space. The exhaust unit may include a plurality of individual exhaust pipes directly connected to the treatment spaces in one process chamber or the plurality of process chambers, a main exhaust pipe connected to the plurality of individual exhaust pipes, a pressure reducing member installed in the main exhaust pipe to reduce pressure of the treatment space, and a damper member mounted in each of the individual exhaust pipes to adjust an amount of gas exhausted through the individual exhaust pipe. The damper member may include a first damper to adjust an amount of gas exhausted from the treatment spaces, and a second damper disposed downstream of the first damper to buffer a pressure change caused by adjusting the first damper.

According to an embodiment, the apparatus may further include an external air introducing member installed in each of the individual exhaust pipe to introduce external air.

According to an embodiment, the second damper may be disposed downstream of the external air introducing member.

According to an embodiment, the apparatus may further include a controller to control the damper member, and the controller may control the first damper such that an opening ratio of the first damper is changed while a process is being performed in the treatment spaces.

According to an embodiment, the controller may control the second damper such that the second damper is maintained with a fixed opening ratio, which is preset, while the process is being performed in each treatment space.

According to an embodiment, the individual exhaust pipe may include a first exhaust part connected to each of the treatment spaces, and a second exhaust part, which extends in a direction different from a longitudinal direction of the first exhaust part from a lower end of the first exhaust part and has the damper member mounted in the second exhaust part. Slope may be formed at a corner facing a connection area between the first exhaust part and the second exhaust part.

According to an embodiment, the individual exhaust pipes may exhaust gas from two adjacent treatment spaces, respectively, the individual exhaust pipe may include a first exhaust pipe connected to a first treatment space of the treatment spaces, a second exhaust pipe connected to a second treatment space of the treatment spaces, and a connection pipe to connect the first exhaust pipe to the second exhaust pipe and connected to the main exhaust pipe. The damper member may be installed in the connection pipe.

According to an embodiment, the first exhaust pipe and the second exhaust pipe may be arranged in a 'V' shape and connected to the connection pipe.

According to an embodiment, the connection pipe may be formed such that an internal sectional area of a connection region between the connection pipe and the main exhaust pipe is gradually increased toward the main exhaust pipe.

According to an exemplary embodiment, a method for treating a substrate is provided. According to an embodiment, in the method for treating the substrate, the second damper may be maintained with a preset opening ratio and an opening ratio of the first damper may be changed, in each of the individual exhaust pipes while treatment is being performed in each of the treatment spaces.

According to an embodiment, treatment for the substrate may be to perform a process of forming a photoresist film on the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Figure 1:
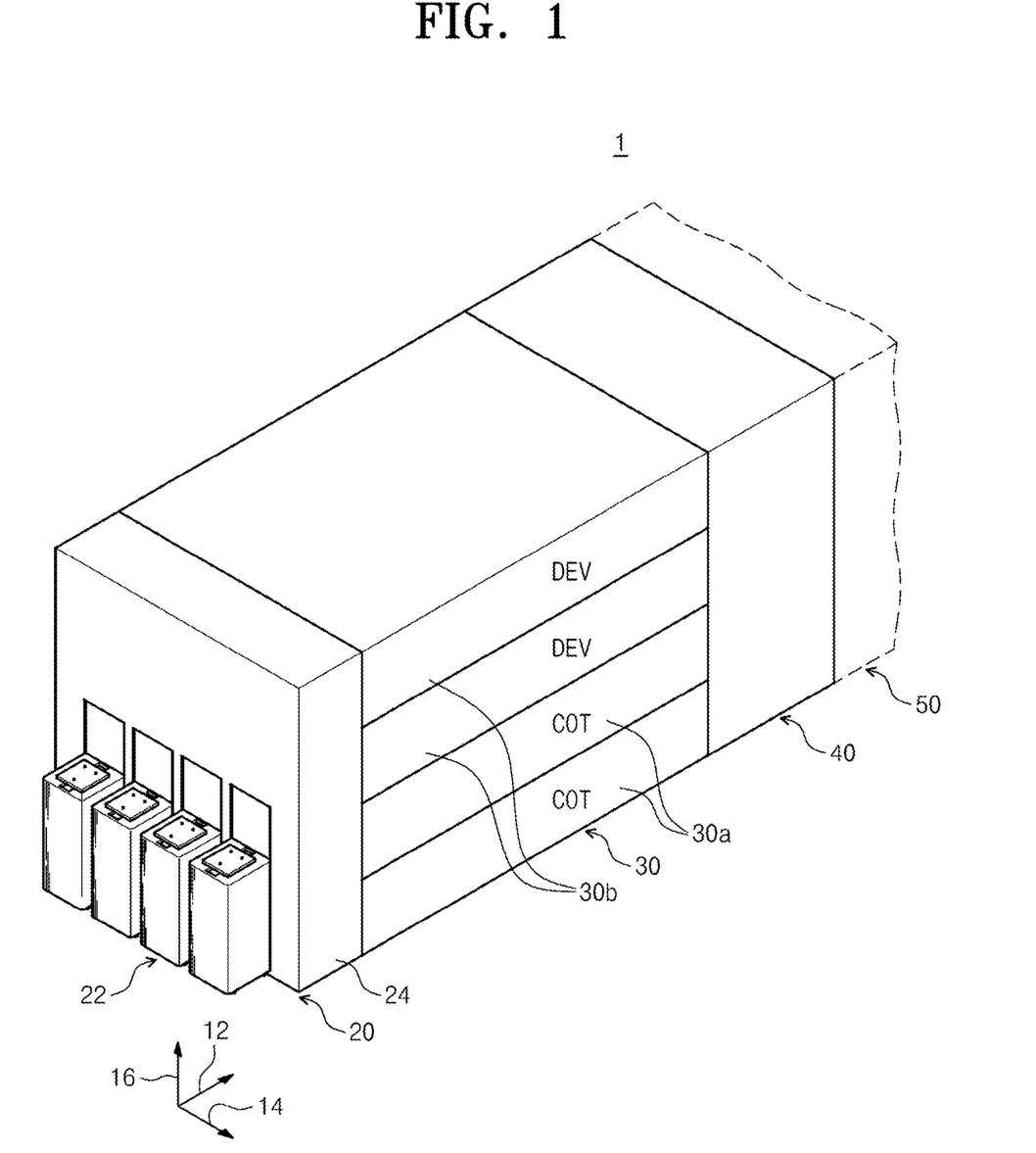
FIG. 1 is a perspective view schematically illustrating an apparatus for treating a substrate, according to an embodiment of the inventive concept.
Figure 2:
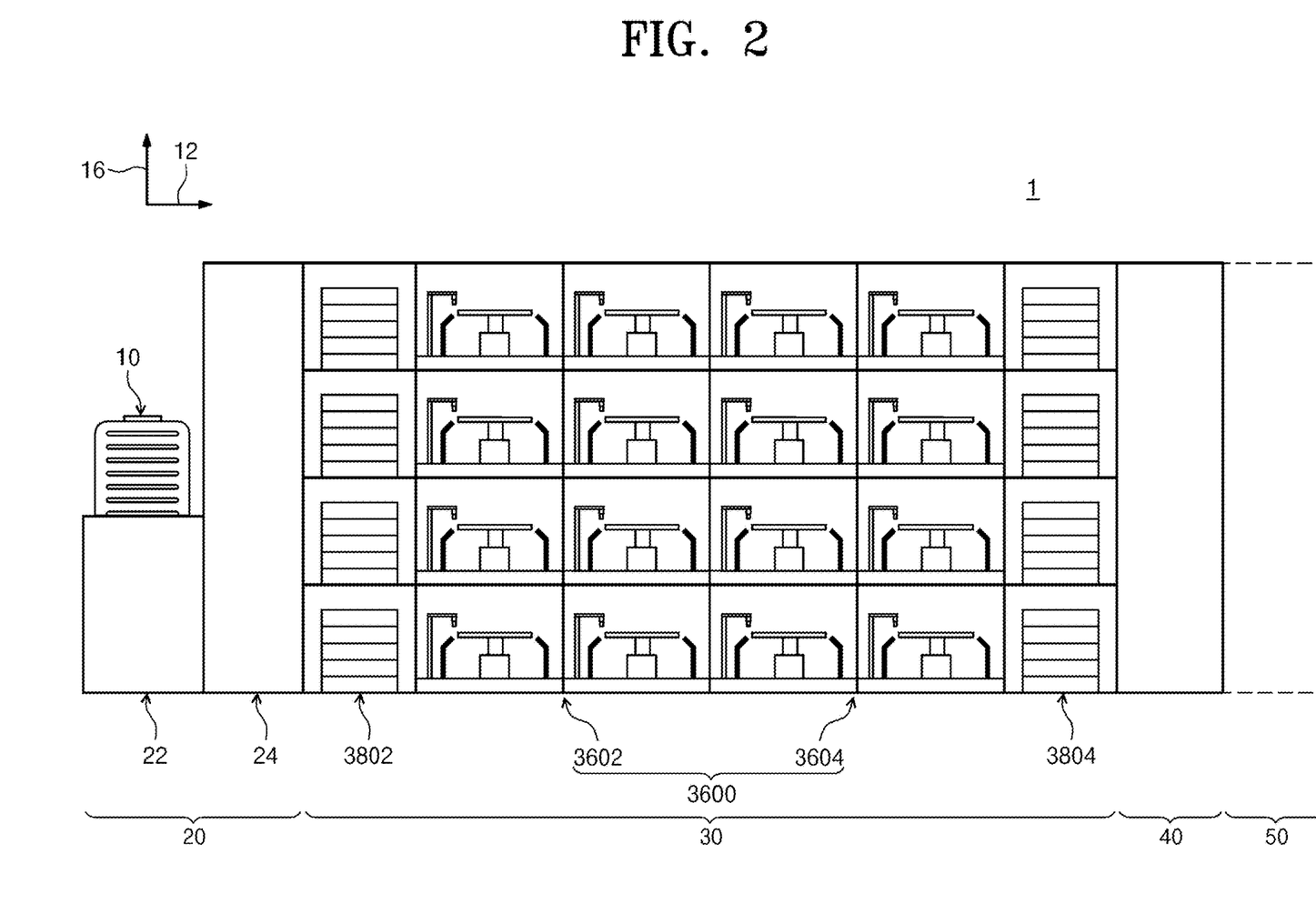
FIG. 2 is a cross-sectional view illustrating an apparatus of treating a substrate including a coating block or a developing block of FIG. 1.
Figure 3:
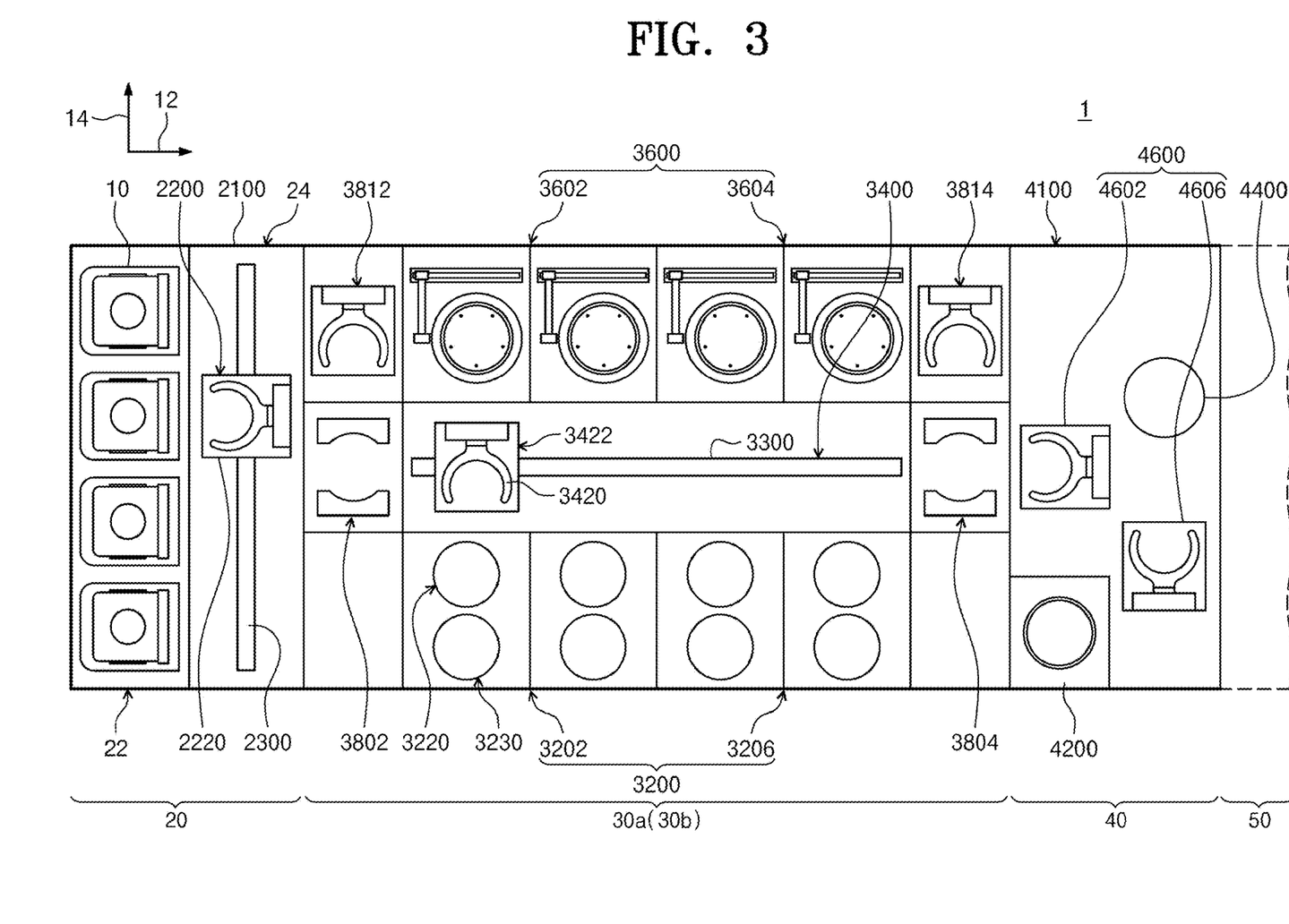
FIG. 3 is a plan view illustrating an apparatus for treating a substrate of FIG. 1.

FIG. 1 is a perspective view schematically illustrating an apparatus for treating a substrate, according to an embodiment of the inventive concept, FIG. 2 is a sectional view illustrating the apparatus for treating the substrate, which includes a coating block or a developing block of FIG. 1, and FIG. 3 is a plan view illustrating the apparatus for treating the substrate of FIG. 1.

Referring to FIGS. 1 to 3, an apparatus 1 for treating a substrate includes an index module 20, a treating module 30, and an interface module 40. According to an embodiment, the index module 20, the treating module 30, and the interface module 40 are sequentially aligned in line with each other. Hereinafter, a direction in which the index module 20, the treating module 30, and the interface module 40 are arranged will be referred to as a first direction 12, a direction that is perpendicular to the first direction 12 when viewed from above will be referred to as a second direction 14, and a direction perpendicular to all the first direction 12 and the second direction 14 will be referred to as a third direction 16.

The index module 20 carries a substrate 'W' to the treating module 30 from a container 10 having the substrate 'W' received therein, and a substrate 'W' completely treated is received into the container 10. A longitudinal direction of the index module 20 is provided in the second direction 14. The index module 20 has a load port 22 and an index frame 24. The load port 22 is positioned at an opposite side to the treating module 30, based on the index frame 24. The container 10 having substrates 'W' is placed on the load port 22. A plurality of load ports 22 may be provided and may be arranged in the second direction 14.

The container 10 may include a container 10, such as a front open unified pod (FOUP), for sealing. The container 10 may be placed on the load port 22 by a transfer unit (not illustrated) such as Overhead Transfer, Overhead Conveyor, or Automatic Guided Vehicle, or a worker.

An index robot 2200 is provided inside the index frame 24. A guide rail 2300, which has a longitudinal direction in the second direction 14, is provided in the index frame 24, and the index robot 2200 may be provided to be movable on the guide rail 2300. The index robot 2200 may include a hand 2220 in which the substrate 'W' is positioned, and the hand 2220 may be provided to be movable forward and backward, rotatable about the third direction 16, and movable in the third direction 16.

The treating module 30 performs coating and developing processes with respect to the substrate 'W'. The treating module 30 has a coating block 30a and a developing block 30b. The coating block 30a performs the coating process with respect to the substrate 'W', and the developing block 30b performs the developing process with respect to the substrate 'W'. A plurality of coating blocks 30a are provided and stacked on each other. A plurality of developing blocks 30b are provided and stacked on each other. According to an embodiment of FIG. 1, two coating blocks 30a are provided and two developing blocks 30b are provided. The coating blocks 30a may be disposed under the developing blocks 30b. According to an example, two coating blocks 30a may be subject to the same process and may be provided in the same structure. In addition, two developing blocks 30a may be subject to the same process and may be provided in the same structure.

Referring to FIG. 3, the coating block 30a has a heat treating chamber 3200, a carrying chamber 3400, a liquid treating chamber 3600, and a buffer chamber 3802, 3804. The heat treating chamber 3200 performs a heat treatment process with respect t to the substrate 'W'. The heat treatment process may include a cooling process and a heating process. The liquid treating chamber 3600 supplies a liquid onto the substrate 'W' to form a liquid film. The liquid film may be a photoresist film or an anti-reflective film. The carrying chamber 3400 carries the substrate 'W' between the heat treating chamber 3200 and the liquid treating chamber 3600 inside the coating block 30a.

The carrying chamber 3400 has a longitudinal direction parallel to the first direction 12. A carrying robot 3422 is provided in the carrying chamber 3400. The carrying robot 3422 carries the substrate 'W' among the heat treating chamber 3200, the liquid treating chamber 3600, and the buffer chamber 3800. According to an example, the carrying robot 3422 may include a hand 3420 in which the substrate 'W' is positioned, and the hand 3420 may be provided to be movable forward and backward, rotatable about the third direction 16, and movable in the third direction 16. A guide rail 3300, which has a longitudinal direction parallel to the second direction 14, is provided in the index frame 3400, and the carrying robot 3422 may be provided to be movable on the guide rail 3300.

A plurality of liquid treating chambers 3600 are provided. Some of the liquid treating chambers 3600 may be provided to be stacked on each other. The liquid treating chambers 3600 are disposed at one side of the carrying chamber 3400. The liquid treating chambers 3600 are arranged side by side in the first direction 12. Some of the liquid treating chambers 3600 are provided in a position adjacent to the index module 20. Hereinafter, these liquid treating chambers 3602 are referred to as front liquid treating chambers. Others of the liquid treating chambers 3600 are provided in a position adjacent to the interface module 40. Hereinafter, these liquid treating chambers 3604 are referred to as rear liquid treating chambers.

A first liquid is coated on the substrate 'W' in the front liquid treating chamber 3602, and a second liquid is coated on the substrate 'W' in the rear liquid treating chamber 3604. The types of the first liquid and the second liquid are different from each other. According to an embodiment, the first liquid is an anti-reflective liquid, and the second liquid is photoresist. Photoresist may be coated on the substrate 'W' coated with an anti-reflective liquid. Alternatively, the first liquid may be photoresist and the second liquid may be an anti-reflective liquid. In this case, the anti-reflective liquid may be coated onto the substrate 'W' coated with the photoresist. Alternatively, the first liquid and the second liquid may be the same type of liquids, and all the first liquid and the second liquid may be photoresists.

Figure 4:
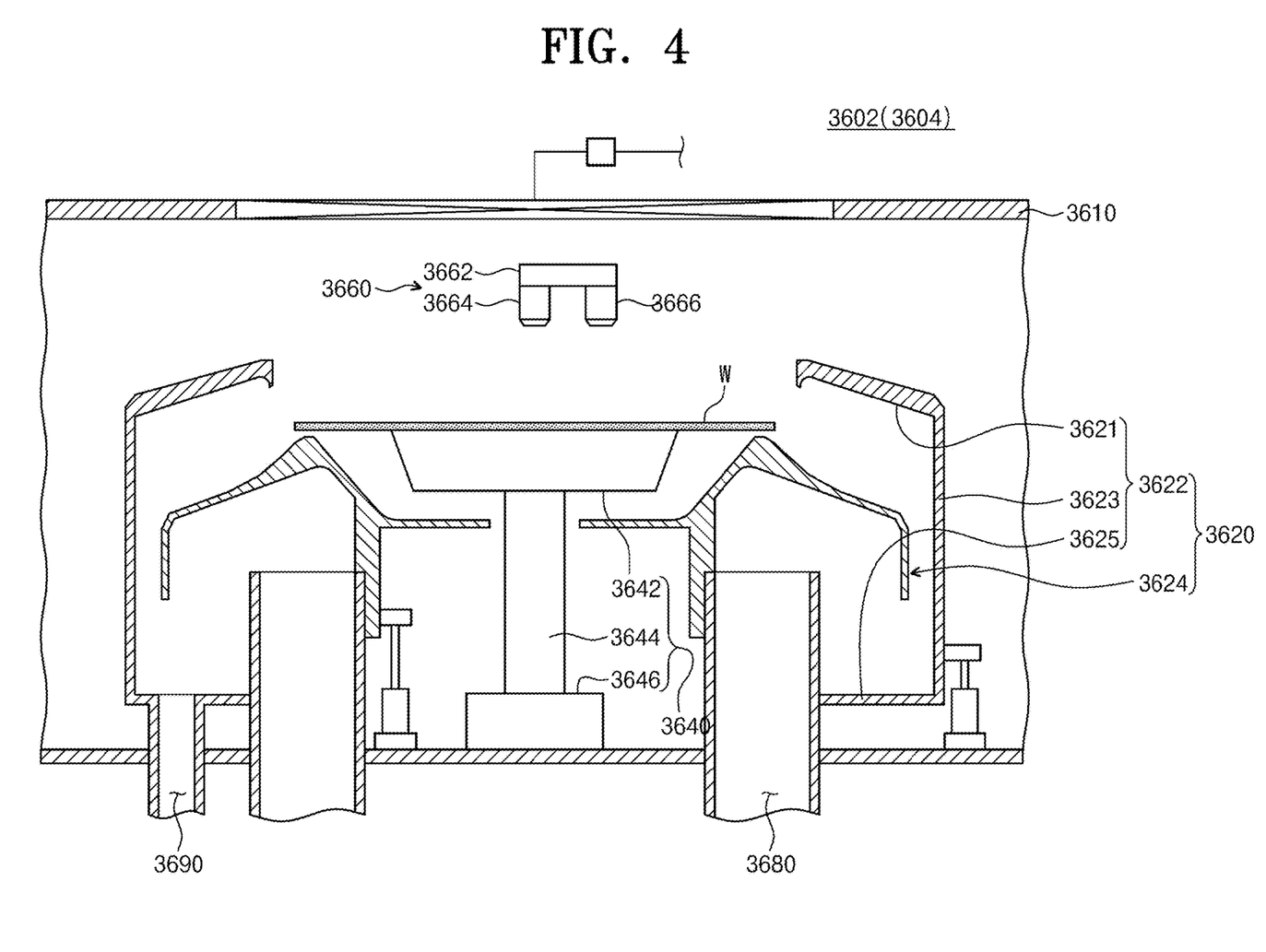
FIG. 4 is a plan view schematically illustrating a liquid treating chamber of FIG. 3.

FIG. 4 is a view schematically illustrating a liquid treating chamber of FIG. 3. Referring to FIG. 4, each substrate treating unit 3602 performs a coating process of coating a treatment liquid, such as a photosensitive liquid, onto the substrate 'W' . The substrate treating unit 3602 may be sequentially arranged in the first direction 12. For example, three substrate treating units 3602 may be positioned in a housing 3610. Each substrate treating unit 3602 includes a substrate support unit 3640, a treating container 3620, and a liquid supply unit 3660.

The substrate support unit 3640 supports the substrate 'W' in an inner space of the housing 3610. The substrate support unit 3640 rotates the substrate 'W'. The substrate support unit 3640 includes a spin chuck 3642, a rotating shaft 3644, and a driver 3646. The spin chuck 3642 serves as a substrate support member 3642 to support the substrate. The spin chuck 3642 is provided to have the shape of a circular plate. The substrate 'W' makes contact with a top surface of the spin chuck 3642.

The rotating shaft 3644 and the driver 3646 serve as rotation members 3644 and 3646 to rotate the spin chuck 3642. The rotating shaft 3644 supports the spin chuck 3642, under the spin chuck 3642. The rotating shaft 3644 is provided such that the longitudinal direction of the rotating shaft 3644 faces a vertical direction. The rotating shaft 3644 is provided to be rotatable about the central axis thereof. The driver 3646 provides driving force such that the rotating shaft 3644 is rotated.

The treating container 3620 is positioned in an inner space of the housing 3610. The treating container 3620 is provided to have the shape of a cup having an open top surface. The treating container 3620 provides a treating space therein. The treating container 3620 is provided to surround the peripheral portion of the substrate support unit 3640. In other words, the substrate support unit 3640 is positioned in the treating space. The treating container 3620 includes an outer cup 3622 and an inner cup 3624. The outer cup 3622 is provided to surround the circumference of the substrate support unit 3640, and the inner cup 3624 is positioned inside the outer cup 3622. Each of the outer cup 3622 and the inner cup 3624 is provided in the shape of an annular ring. The space between the outer cup 3622 and the inner cup 3624 serve as a recovery path to recover the liquid.

The inner cup 3624 is provided in the shape of a circular plate to surround the rotating shaft 3644. When viewed from above, the inner cup 3624 is positioned to be overlapped with an exhaust port 3680. The inner cup 3624 has an inner portion and an outer portion. The top surfaces of the inner portion and the outer portion are provided to be inclined at mutually different angles. When viewed from above, the inner portion is positioned to be overlapped with the spin chuck 3642. The inner portion is positioned to face the rotating shaft 3644. The inner portion faces a direction more inclined upward as the inner portion becomes gradually away from the rotating shaft 3644, and the outer portion extends outward from the inner portion. The outer portion faces a direction more inclined downward as the outer portion becomes gradually away from the rotating shaft 3644. An upper end of the inner portion may be aligned in line with a side portion of the substrate 'W' in the vertical direction. According to an embodiment, a point at which the outer portion meets the inner portion may be positioned lower than that of the upper end of the inner portion. The point at which the inner portion meets the outer portion may be provided to be rounded. The outer portion is combined with the outer cup 3622 to form a recovery path to recover the treatment liquid.

The outer cup 3622 is provided to have the shape of a cup to surround the substrate support unit 3640 and the inner cup 3624. The outer cup 3622 has a bottom part 3625, a side part 3623, and an inclined part 3621. The bottom part 3625 is provided to have the shape of a circular plate having a hollow. A recovery line 3690 is connected to the bottom part 3625. The recovery line 3690 recovers a treatment liquid supplied on the substrate 'W'. The treatment liquid recovered by the recovery line 3690 may be reused by an external liquid regeneration system. The side part 3623 is provided to have the shape of an annular ring to surround the substrate support unit 3640. The side part 3623 extends in the vertical direction from the side end of the bottom part 3625. The side part 3623 extends upward from the bottom part 3625.

The inclined part 3621 extends from an upper end of the side part 3623 in the direction toward the central axis of the outer cup 3622. The inner surface of the inclined part 3621 is provided to be more inclined upward as the inner surface of the inclined part 3621 becomes gradually close to the substrate support unit 3640. The inclined part 3621 is provided to have the shape of a ring. During the liquid treatment process of the substrate 'W', the upper end of the inclined part 3621 is positioned higher than the substrate 'W' supported by the substrate support unit 3640.

The liquid supply unit 3660 supplies a treatment liquid and a pre-wet liquid onto the substrate 'W'. The liquid supply unit 3660 includes an arm 3662, pre-wet nozzles 3666, and a treatment nozzle 3664. The pre-wet nozzle 3666 and the treatment nozzle 3664 are provided on the bottom surface of the arm 3662. Alternatively, a plurality of arms 3662 may be provided, and the pre-wet nozzle 3666 and the treatment nozzle 3664 may be mounted on each arm 3662. In addition, the arm 3662 may be coupled to a rotating shaft having the longitudinal direction facing the third direction 16.

The pre-wet nozzle 3666 supplies the pre-wet liquid onto the substrate 'W', and the treatment nozzle 3664 supplies the treatment liquid onto the substrate 'W' . For example, the pre-wet liquid may be a liquid to change the surficial property of the substrate 'W'. The pre-wet liquid may change the surface of the substrate 'W' to a surface having a hydrophobic property. The pre-wet liquid may be a thinner, and the treatment liquid may be a photoresist liquid such as a photosensitive liquid.

Referring to FIG. 3, a plurality of buffer chambers 3800 are provided. Some of buffer chambers 3800 are interposed between the index module 20 and the carrying chamber

3400. Hereinafter, the buffer chamber is referred to as a front buffer. A plurality of front buffers 3802 are provided and stacked on each other in the vertical direction. Others of the buffer chambers 3802 and 3804 are interposed between the carrying chamber 3400 and the interface module 40. The buffer chamber is referred to as a rear end buffer 3804. A plurality of front buffers 3804 are provided and stacked on each other in the vertical direction. The front buffers 3802 and the rear buffers 3804 temporarily store a plurality of substrates 'W'. The substrate 'W' stored in the front buffer 3802 is introduced and withdrawn by the index robot 2200 and the carrying robot 3422. The substrate 'W' stored in the rear buffer 3804 is introduced and withdrawn by the carrying robot 3422 and the first carrying robot 4602.

The developing block 30*b* has the heat treating chamber 3200, the carrying chamber 3400, and the liquid treating chamber 3600. The heat treating chamber 3200, the carrying chamber 3400, and the liquid treating chamber 3600 in the developing block 30*b* are provided in a structure and arrangement substantially similar to the heat treating chamber 3200, the carrying chamber 3400, and the liquid treating chamber 3600 in the coating block 30*a*. However, all the liquid treating chambers 3600 in the developing block 30*b* supply the same developing liquid such that the substrate 'W' is subject to the developing treatment.

The interface module 40 connects the treating module 30 with an external exposure device 50. The interface module 40 has an interface frame 4100, an additional process chamber 4200, an interface buffer 4400, and a carrying member 4600.

The additional process chamber 4200, the interface buffer 4400, and the carrying member 4600 are provided inside the interface frame 4100. The substrate 'W' subject to the process in the coating block 30*a* may be subject to a predetermined additional process in the additional process chamber 4200 before introduced into the exposure device 50. Alternatively, the substrate 'W' subject to the process in the exposure device 50 may be subject to a predetermined additional process in in the additional process chamber 4200 before introduced into the developing block 30*b*. According to an embodiment, the additional process may be an edge exposure process to expose an edge region of the substrate 'W', a top surface cleaning process to clean the top surface of the substrate 'W', or a bottom surface cleaning process to clean the bottom surface of the substrate 'W'. A plurality of additional process chambers 4200 may be provided and may be provided to be stacked on each other. All the additional process chambers 4200 may be provided to perform the same process. Alternatively, some of the additional process chambers 4200 may be provided to perform mutually different processes.

The interface buffer 4400 provides a space to temporarily stay the substrate 'W', which is carried among the interface buffer 4400, the coating block 30*a*, the additional process chamber 4200, the exposure device 50, and the developing block 30*b*. A plurality of interface buffers 4400 are provided and may be provided to be stacked on each other.

According to an embodiment, when viewed based on a line extending in the longitudinal direction of the carrying chamber 3400, the additional process chamber 4200 may be disposed at one side, and the interface buffer 4400 may be disposed at an opposite side.

The carrying member 4600 carries the substrate 'W' between the coating block 30*a*, the additional process chamber 4200, the exposure device 50, and the developing block 30*b*. The carrying member 4600 may be provided with one or a plurality of robots. According to an embodiment, the carrying member 4600 has a first robot 4602 and a second robot 4606. The first robot 4602 may carry the substrate 'W' among the coating block 30*a*, the additional process chamber 4200, and the interface buffer 4400, the second robot 4606 may be provided to carry the substrate 'W' between the interface buffer 4400 and the exposure device 50, and the second robot 4606 may be provided to carry the substrate 'W' between the interface buffer 4400 and the developing block 30*b*.

Each of the first robot 4602 and the second robot 4606 includes a hand. The hand may be provided to be movable forward and backward, rotatable about an axis parallel to the third direction 16, and movable in the third direction 16.

The hands of the index robot 2200, the first robot 4602, and the second robot 4606 may be provided in the same shape as those of the hands 3420 of the carrying robots 3422 and 3424. Alternatively, the hand of the robot to directly transfer and receive the substrate 'W' together with the carrying plate 3240 of the heat treating chamber are provided in the same shapes as those of the hands 3420 of the carrying robots 3422 and 3424, and the hand of the remaining robot may be provided in the shape different from the shapes.

According to an embodiment, the index robot 2200 may be provided to directly transfer and receive the substrate 'W' together with the front heat treating chamber 3200 provided in the coating block 30*a*.

In addition, the carrying robot 3422 provided to the coating block 30*a* and the developing block 30*b* may be provided to directly transfer and receive the substrate 'W' together with the carrying plate 3240 positioned in the heat treating chamber 3200.

A plurality of heat treating chambers 3200 are provided. The heat treating chambers 3200 are arranged in the first direction 12. The heat treating chambers 3200 are positioned at one side of the carrying chamber 3400.

Figure 5:
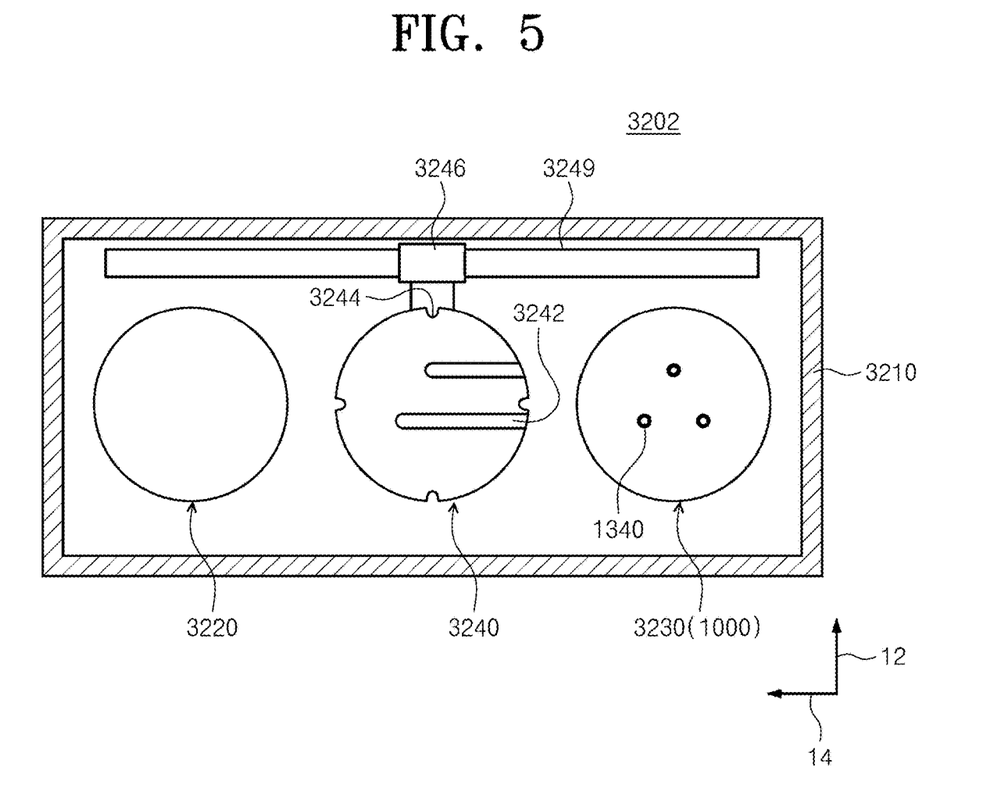
FIG. 5 is a plan view schematically illustrating a heat treating chamber of FIG. 3.
Figure 6:
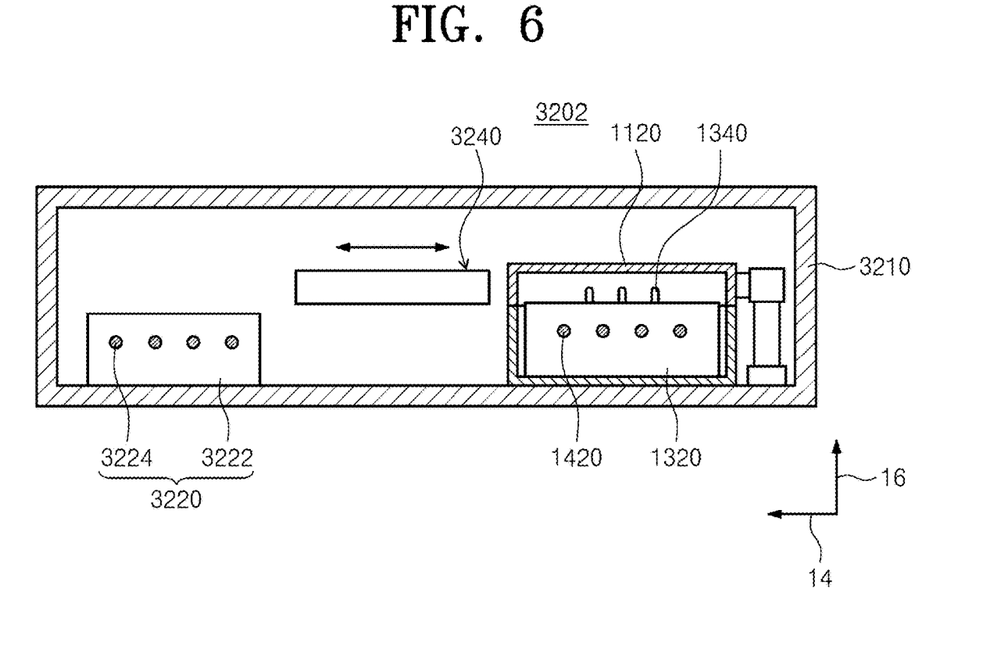
FIG. 6 is a front view illustrating a heat treating chamber of FIG. 5.

FIG. 5 is a plan view schematically illustrating a heat treating chamber of FIG. 3, and FIG. 6 is a front view illustrating the heat treating chamber of FIG. 5. Referring to FIGS. 5 and 6, the heat treating chamber 3200 has a housing 3210, a cooling unit 3220, a heating unit 3230, and a carrying plate 3240.

The housing 3210 substantially has a rectangular parallelepiped shape. The housing 3210 is formed in a sidewall thereof with an entrance (not illustrated) to introduce or withdraw the substrate 'W'. The entrance may be maintained in an open sate. A door (not illustrated) may be provided to selectively open or close the entrance. The cooling unit 3220, the heating unit 3230, and the carrying plate 3240 are provided in the housing 3210. The cooling unit 3220 and the heating unit 3230 are provided side by side along the second direction 14. According to an embodiment, the cooling unit 3220 may be positioned more closely to the carrying chamber 3400 rather than the heating unit 3230.

The cooling unit 3220 has a cooling plate 3222. The cooling plate 3222 may have a substantially circular shape when viewed from above. The cooling plate 3222 has a cooling member 3224. According to an embodiment, the cooling member 3224 may be formed inside the cooling plate 3222 to serve as a fluid passage through which a cooling fluid flows.

The heating unit 3230 serves as a device 1000 to heat the substrate 'W' to be a temperature higher than a room temperature. The heating unit 3230 heats the substrate 'W' under the atmosphere of normal pressure or reduced power lower than the normal pressure.

The conveying plate 3240 is provided in the shape of a substantially circular plate, and has a diameter corresponding to that of the substrate 'W'. A notch 3244 is formed at the edge of the carrying plate 3240. When the vertical positions of the hand 3420 and the carrying plate 3240 are changed in the state that the hand 3420 and the carrying plate 3240 are aligned in the vertical direction, the substrate 'W' is transferred between the hand 3420 and the carrying plate 3240. The carrying plate 3240 may be mounted on the guide rail 3249, and may move along the guide rail 3249 by the driver 3246. A plurality of guide grooves 3242 are provided in the shape of a slit in the carrying plate 3240. The guide groove 3242 extends inward from an end portion of the carrying plate 3240. The guide groove 3242 has the longitudinal direction provided in the second direction 14, and guide grooves 3242 may be spaced apart from each other in the first direction 12. The guide groove 3242 prevents the interference between the carrying plate 3240 and a lift pin 1340 when the substrate 'W' is transferred between the carrying plate 3240 and the heating unit 3230

The heating of the substrate 'W' is performed in the state that the substrate 'W' is directly placed on the carrying plate 3240. The cooling of the substrate 'W' is performed in the state that the carrying plate 3240, on which the substrate 'W' is placed, makes contact with the cooling plate 3222. The carrying plate 3240 is formed of a material having a heat transfer coefficient such that heat is smoothly transferred between the cooling plate 3222 and the substrate 'W'. According to an embodiment, the carrying plate 3240 may be formed of a metallic material.

The heating unit 3230 provided in some heat treating chamber of the heat treating chambers 3200 may supply gas during the heating the substrate 'W' to improve the attachment rate of the substrate 'W' having the photoresist. According to an example, gas may be hexamethyldisilane.

Hereinafter, an exhaust unit 900 according to the inventive concept will be described in detail with reference to FIGS. 7 to 10.

Figure 7:
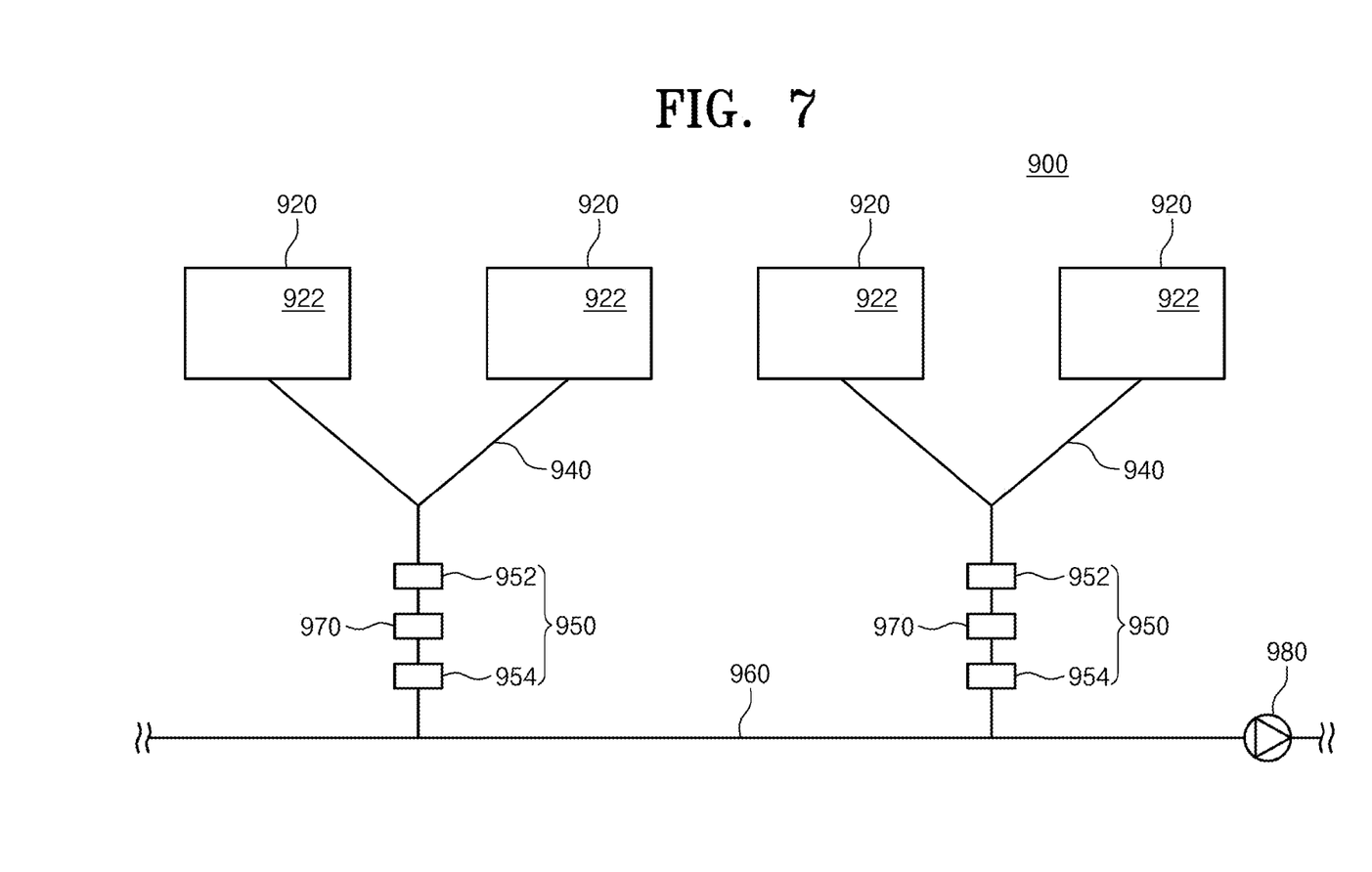
FIG. 7 is a schematic view illustrating an exhaust unit, according to the inventive concept.

FIG. 7 is a schematic view illustrating the exhaust unit 900 according to the inventive concept. Referring to FIG. 7, according to the inventive concept, the exhaust unit 900 may include an individual exhaust pipe 940, a main exhaust pipe 960, a pressure reducing member 980, a damper member 950, and an external air introducing member 970

The individual exhaust pipe 940 is directly connected to a treatment space 922 of a process chamber 920, and the main exhaust pipe 960 is connected to a plurality of individual exhaust pipes 940. The internal atmosphere of the treatment space 922 is exhausted through the individual exhaust pipe 940 and the main exhaust pipe 960.

According to an embodiment, the process chamber 920 may be the liquid treating chamber 3600 described above with reference to FIG. 4 or the heat treating chamber 3200 described with reference to FIGS. 4 to 5.

When the process chamber 920 is the liquid process chamber 3600, the individual exhaust pipe 940 of the exhaust unit 900 may be connected to the exhaust port 3680 of the liquid treating chamber 3600. The exhaust unit 900 exhausts a process by-product generated in the treatment space in the liquid treating chamber 3600. For example, the process by-product may be fume volatilized from the film applied on the substrate 'W'. The plurality of chambers are positioned to be stacked on each other, and the exhaust unit 900 may be connected to the exhaust port 3680 to exhaust gas from the treatment space for each chamber.

In one embodiment, the treatment for the substrate 'W' may be the treatment for the substrate 'W' in which a process of forming a photoresist film on the substrate 'W' is performed.

When the process chamber 920 is the heat treating chamber 3200, each individual exhaust pipe 940 of the exhaust unit 900, which is connected to each treatment space 922, may be connected to the main exhaust pipe 960. In this case, the individual exhaust pipe 940 may be connected to a plurality of heat treating chambers 9200. The exhaust unit 900 exhausts the process by-product generated from the treatment space 922 inside the heat treating chamber 3200. For example, the process by-product may be fume volatilized as the substrate 'W' is heated. The plurality of chambers are positioned to be stacked on each other, and the exhaust unit 900 may be provided to exhaust gas from the treatment space for each chamber.

Alternatively, a plurality of exhaust units 900 may be provided, and one of the exhaust units 900 may be connected to chambers positioned on the coating block 30a, and another exhaust unit 900 may be connected to chambers positioned in the developing block 30b.

The pressure reducing member 980 is mounted on the main exhaust pipe 960 to reduce the pressure of the treatment space 922. The reduced pressure provided from the pressure reducing member 980 is transferred to each treatment space 922 through the main exhaust pipe 960 and the individual exhaust pipe 940.

The damper member 950 is mounted in each individual exhaust pipe 940 to change an opening ratio of the individual exhaust pipe 940 to vary the open area of the individual exhaust pipe 940. Accordingly, an exhaust amount of gas exhausted through the individual exhaust pipe 940 is adjusted. The external air introducing member 970 is installed in each of the individual exhaust pipes 940 to adjust an amount of external air introduced into the individual exhaust pipe 940.

The damper member 950 may include a first damper 952 and a second damper 954. The first damper 952 adjusts an amount of gas exhausted from each treatment space 922. The second damper 954 is disposed downstream of the first damper 952 to buffer a pressure change caused by adjusting the first damper 952.

The actions of the first damper 952 and the second damper 954 will be described later in detail together with the method for treating the substrate according to the inventive concept. The inventive concept may include a controller, and the controller may control each damper member 950 to perform the method for processing the substrate according to the inventive concept.

A conventional damper member includes only a single damper. When the opening ratio of the first individual exhaust pipe, which is any one individual exhaust pipe, is rapidly changed during the process, even if the second individual exhaust pipe, which is positioned adjacent to the first individual exhaust pipe, is not changed, the pressure of the second individual exhaust pipe is instantly changed. In this case, even if an amount of external air introduced into the first individual exhaust pipe is adjusted, the instantaneous pressure change occurring in the second individual exhaust pipe may not be avoided.

According to the method for treating the substrate of the inventive concept, the second damper 954 is positioned downstream of the first damper 952, and positioned downstream of the external air introducing member 970, and each second damper 954 in each individual exhaust pipe 940 maintains a preset opening ratio, and the first damper 952 changes opening ratio thereof, during the treatment in each treatment space 922.

As the second damper 954 is positioned downstream of the first damper 952 and the external air introducing member 970 and maintains the opening ratio thereof, even if the opening ratio of the first damper 952 is changed or the pressure transferred from the main exhaust pipe 960 to the first individual exhaust pipe, which is one of the individual exhaust pipes 940, is instantaneously changed, the instantaneous pressure change of the second individual exhaust pipe, which is another individual exhaust pipe 940 adjacent thereto, is not large.

Figure 8:
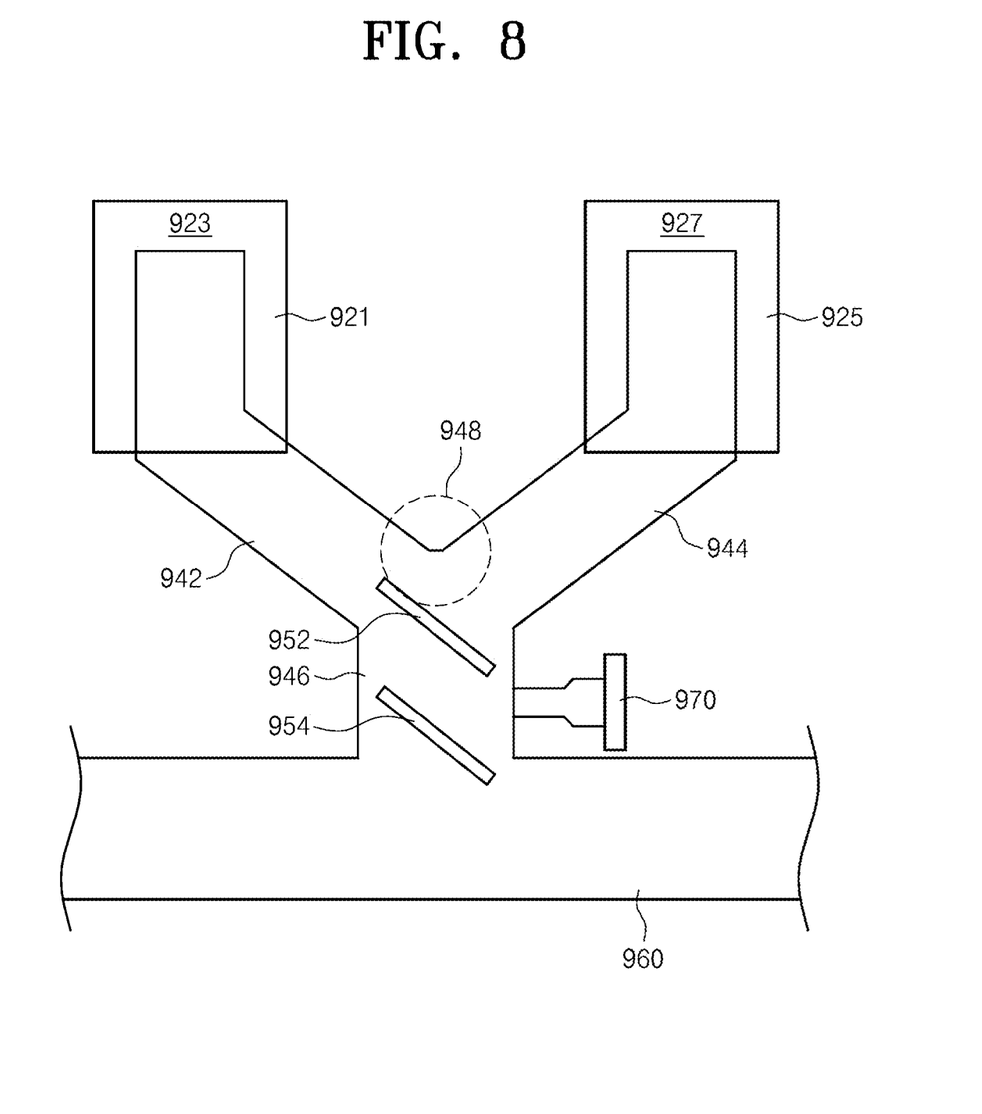
FIGS. 8 to 10 are schematic view illustrating an exhaust unit, according to an embodiment of the inventive concept.
Figure 9:
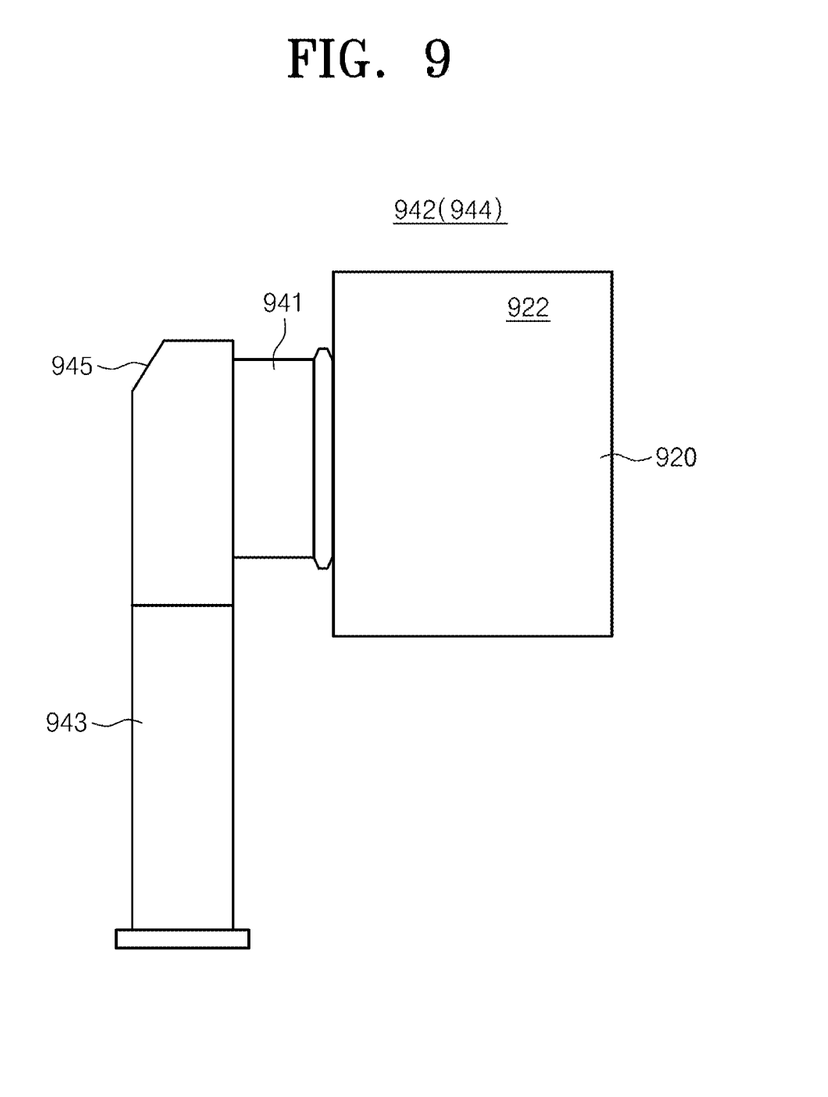
Figure 10:
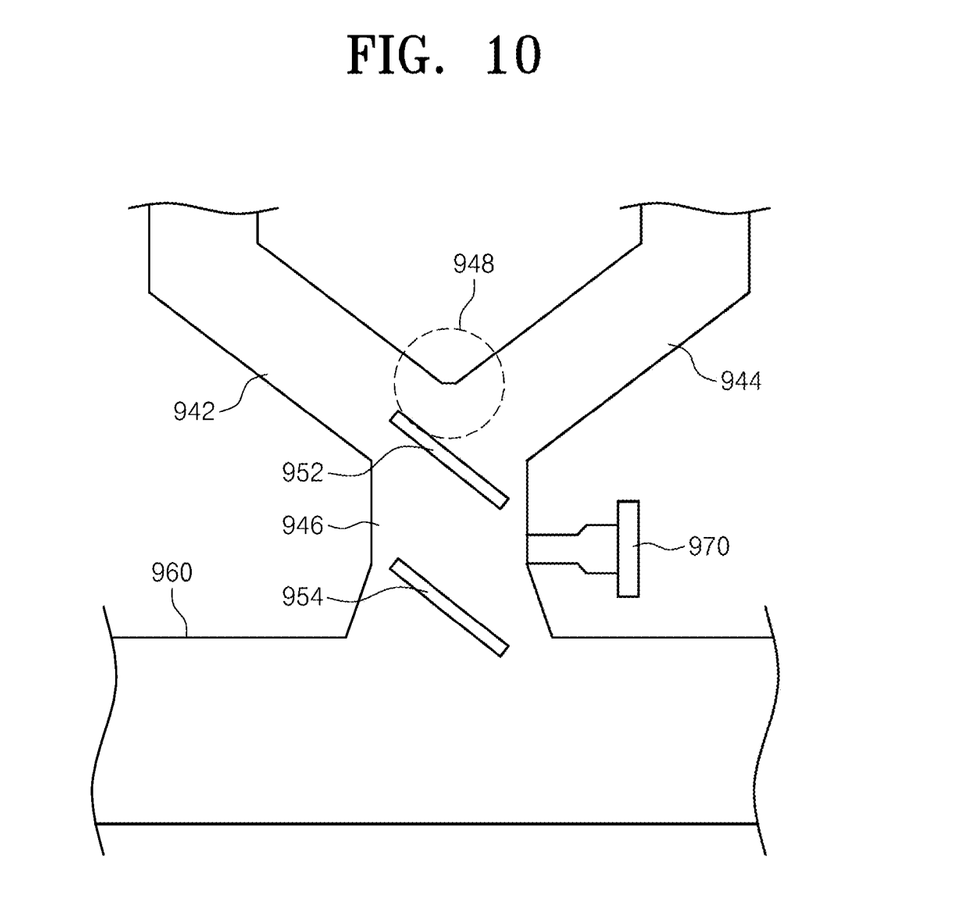

FIGS. 8 and 10 views illustrating an exhaust unit 900, according to an embodiment of the inventive concept.

Each individual exhaust pipe 940 is provided to exhaust gas from two adjacent treatment spaces 922. In this case, the treatment space 922 may be a space in which the substrate is treated within a single or a plurality of process chambers 920.

Referring to FIG. 8, the individual exhaust pipe 940 may include a first exhaust pipe 942 connected to a first treatment space 923 of the treatment space 922, a second exhaust pipe 944 connected to the second treatment space 927 of the treatment space 922, and a connection pipe 946 to connect the first exhaust pipe 942 to the second exhaust pipe 944, and connected to the main exhaust pipe 960. A damper member 950 may be mounted in the connection pipe 946.

The first exhaust pipe 942 and the second exhaust pipe 944 are connected to the connection pipe 946, in a V-shaped arrangement form 948. As the conventional individual exhaust pipe 940 does not include slope at a connection part between the first exhaust pipe 942 and the second exhaust pipe 944, an exhaust loss may be caused.

According to the inventive concept, the first exhaust pipe 942, the second exhaust pipe 944, and the connection pipe 946 are provided to be connected to each other at a predetermined angle as in the V-shaped arrangement form 948. Accordingly, the exhaust loss may be minimized at a point in which the path of gas transmitted from each exhaust pipe is switched.

Referring to FIG. 9, a first exhaust part 941, which is connected to each treatment space 922, and a second exhaust part 943, which extends in a direction different from a longitudinal direction of the first exhaust part 941 from a lower end of the first exhaust part 941 and has a damper member 950 mounted at the second exhaust part 943, may be provided. The gas exhausted from each treatment space 922 passes through the first exhaust part 941, and the path of the gas is switched at a connection region between the first exhaust part 941 and the second exhaust part 943. Conventionally, the connection region is formed at a right angle, so the exhaust loss is caused.

According to the inventive concept, slope is formed at a corner 945 facing the connection region between the first exhaust part 941 and the second exhaust part 943, so gas exhausted from each treatment space is flexibly switched in the path of the gas. Accordingly, the exhaust loss may be minimized.

Referring to FIG. 10, the connection pipe 946 may be formed such that the internal sectional area of a connection region between the connection pipe 946 and the main exhaust pipe 960 is gradually increased toward the main exhaust pipe 960.

The connection region to the main exhaust pipe 960 from the connection pipe 946 is formed to be tapered, so the exhaust loss, which is caused as gas moves from a narrower pipe to a wider pipe, may be minimized.

The above description has been made for the illustrative purpose. Furthermore, the above-mentioned contents describe the exemplary embodiment of the inventive concept, and the inventive concept may be used in various other combinations, changes, and environments. In other words, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

According to an embodiment of the inventive concept, the second damper is mounted to prevent the exhaust interference between the first dampers, thereby improving the pressure hunting phenomenon.

According to an embodiment of the inventive concept, as the slope is formed at the individual exhaust pipe, thereby improving the exhaust loss.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a plurality of process chambers defining a treatment space in each of the process chamber, the plurality of process chambers configured to process the substrate in each of the treatment spaces; and
    an exhaust unit configured to exhaust gas from each of the treatment spaces,
    wherein the exhaust unit includes:
    a plurality of individual exhaust pipes directly connected to a respective one of the treatment spaces in one or more of the plurality of process chambers;
    a main exhaust pipe connected to the plurality of individual exhaust pipes;
    a pressure reducing member installed in the main exhaust pipe, pressure reducing member configured to reduce pressure of the respective treatment spaces; and
    a damper member mounted in each individual exhaust pipe of the plurality of exhaust pipes, the damper member configured to adjust an amount of gas exhausted through the individual exhaust pipe, and
    wherein the damper member includes:
    a first damper configured to adjust an amount of gas exhausted from the respective treatment spaces; and
    a second damper downstream of the first damper and least partially upstream from a fork connection between the individual exhaust pipe and the main exhaust pipe, the second damper configured to buffer a pressure change caused by adjusting the first damper.

2. The apparatus of claim 1, further comprising:
a controller configured to control the damper member, wherein the controller is configured to control the first damper such that an opening ratio of the first damper is changed while a process is being performed in the treatment spaces.

3. The apparatus of claim 2, wherein the controller is configured to control the second damper to be maintained with a fixed opening ratio, which is preset, while the process is being performed in each of the treatment spaces.

4. The apparatus of claim 1, further comprising:
an external air introducing member installed in each of the individual exhaust pipes and configured to introduce external air.

5. The apparatus of claim 1, wherein an individual exhaust pipe from among the plurality of individual exhaust pipes includes:
a first exhaust part connected to each of the treatment spaces; and
a second exhaust part, which extends in a direction different from a longitudinal direction of the first exhaust part from a lower end of the first exhaust part and has the damper member mounted in the second exhaust part, and
wherein a slope is formed at a corner facing a connection area between the first exhaust part and the second exhaust part.

6. An apparatus for treating a substrate, the apparatus comprising:
a plurality of process chambers defining a treatment space in each of the process chamber, the plurality of process chambers configured to process the substrate in each of the treatment spaces; and
an exhaust unit configured to exhaust gas from each of the treatment spaces,
wherein the exhaust unit includes:
a plurality of individual exhaust pipes directly connected to a respective one of the treatment spaces in one or more of the plurality of process chambers;
a main exhaust pipe connected to the plurality of individual exhaust pipes;
a pressure reducing member installed in the main exhaust pipe, the pressure reducing member configured to reduce pressure of the respective treatment spaces; and
a damper member mounted in each individual exhaust pipe of the plurality of exhaust pipes, the damper member configured to adjust an amount of gas exhausted through the individual exhaust pipe, and
wherein the damper member includes:
a first damper configured to adjust an amount of gas exhausted from the respective treatment spaces; and
a second damper downstream of the first damper, the second damper configured to buffer a pressure change caused by adjusting the first damper,
the apparatus further comprising:
an external air introducing member installed in each of the individual exhaust pipes and configured to introduce external air.

7. The apparatus of claim 6, wherein the second damper is downstream of the external air introducing member.

8. The apparatus of claim 6, wherein the second damper is at least partially upstream from a fork connection between the individual exhaust pipe and the main exhaust pipe.

9. The apparatus of claim 6, wherein an individual exhaust pipe from among the plurality of individual exhaust pipes includes:
a first exhaust part connected to each of the treatment spaces; and
a second exhaust part, which extends in a direction different from a longitudinal direction of the first exhaust part from a lower end of the first exhaust part and has the damper member mounted in the second exhaust part, and
wherein a slope is formed at a corner facing a connection area between the first exhaust part and the second exhaust part.

10. An apparatus for treating a substrate, the apparatus comprising:
a plurality of process chambers defining a treatment space in each of the process chamber, the plurality of process chambers configured to process the substrate in the treatment spaces; and
an exhaust unit configured to exhaust gas from the treatment space,
wherein the exhaust unit includes:
a plurality of individual exhaust pipes directly connected to the treatment spaces in one or more of the plurality of process chambers;
a main exhaust pipe connected to the plurality of individual exhaust pipes;
a pressure reducing member installed in the main exhaust pipe, the pressure reducing member configured to reduce pressure of the treatment space; and
a damper member mounted in each individual exhaust pipe of the plurality of individual exhaust pipes, the damper member configured to adjust an amount of gas exhaust through the individual exhaust pipe, and
wherein the damper member includes:
a first damper configured to adjust an amount of gas exhausted from the treatment spaces; and
a second damper downstream of the first damper and configured to buffer a pressure change caused by adjusting the first damper,
wherein an individual exhaust pipe from amount the plurality of individual exhaust pipes includes:
a first exhaust part connected to each of the treatment spaces; and
a second exhaust part, which extends in a direction different from a longitudinal direction of the first exhaust part from a lower end of the first exhaust part and has the damper member mounted in the second exhaust part, and
wherein a slope is formed at a corner facing a connection area between the first exhaust part and the second exhaust part.

11. The apparatus of claim 10, further comprising:
an external air introducing member installed in each of the individual exhaust pipes and configured to introduce external air.

12. The apparatus of claim 10, wherein the second damper is at least partially upstream from a fork connection between the individual exhaust pipe and the main exhaust pipe.

13. An apparatus for treating a substrate, the apparatus comprising:
a plurality of process chambers defining a treatment space in each of the process chamber, the plurality of process chambers configured to process the substrate in the treatment spaces; and
an exhaust unit configured to exhaust gas from the treatment space, wherein the exhaust unit includes:

a plurality of individual exhaust pipes directly connected to the treatment spaces in one or more of the plurality of process chambers;

a main exhaust pipe connected to the plurality of individual exhaust pipes;

a pressure reducing member installed in the main exhaust pipe, the pressure reducing member configured to reduce pressure of the treatment space; and a damper member mounted in each individual exhaust pipe from among the plurality of individual exhaust pipes, the damper member configured to adjust an amount of gas exhausted through the individual exhaust pipe, and wherein the damper member includes:

a first damper configured to adjust an amount of gas exhausted from the treatment spaces; and a second damper downstream of the first damper and configured to buffer a pressure change caused by adjusting the first damper, wherein an individual exhaust pipe form among the plurality of individual exhaust pipes is configured to exhaust gas from two adjacent treatment spaces, respectively, wherein the individual exhaust pipe includes:

a first exhaust pipe connected to a first treatment space of the treatment spaces;

a second exhaust pipe connected to a second treatment space of the treatment spaces; and a connection pipe configured to connect the first exhaust pipe to the second exhaust pipe and connected to the main exhaust pipe, and wherein the damper member is installed in the connection pipe.

14. The apparatus of claim 13, wherein the first exhaust pipe and the second exhaust pipe are arranged in a 'V' shape and connected to the connection pipe.

15. The apparatus of claim 13, wherein the connection pipe is arranged such that an internal sectional area of a connection region between the connection pipe and the main exhaust pipe is gradually increased toward the main exhaust pipe.

16. The apparatus of claim 13, further comprising:

an external air introducing member installed in each of the individual exhaust pipes and configured to introduce external air.

17. The apparatus of claim 13, wherein the second damper is at least partially upstream from a fork connection between the individual exhaust pipe and the main exhaust pipe.

18. The apparatus of claim 13, wherein an individual exhaust pipe from among the plurality of individual exhaust pipes includes:

a first exhaust part connected to each of the treatment spaces; and a second exhaust part, which extends in a direction different from a longitudinal direction of the first exhaust part from a lower end of the first exhaust part and has the damper member mounted in the second exhaust part, and wherein a slope is formed at a corner facing a connection area between the first exhaust part and the second exhaust part.

\* \* \* \* \*